United States Patent

[11] 3,625,758

[72] Inventors Fritz Theodor Stahl
Krefeld;
Hedwij Maria Steffen, Geldern, Germany;
Frederick W. Schneble, Jr., Oyster Bay;
John F. McCormack, Roslyn Heights, N.Y.

[21] Appl. No. 617,502
[22] Filed Feb. 21, 1967
[45] Patented Dec. 7, 1971

[73] Assignee Photocircuits Corporation
Glen Cove, N.Y.

[32] Priority Feb. 22, 1966
[33] Germany
[31] P 38829

[54] BASE MATERIAL AND METHOD FOR THE MANUFACTURE OF PRINTED CIRCUITS
14 Claims, No Drawings

[52] U.S. Cl. .......... 117/212, 29/625, 117/47 A, 117/62.1, 117/72, 117/217, 117/218, 174/68.5, 204/15, 204/30

[51] Int. Cl. .......... H05k 3/10, C23c 5/00

[50] Field of Search .......... 29/625; 317/101 A; 174/68.5; 117/212, 217, 47 R

[56] References Cited

UNITED STATES PATENTS

| | | | |
|---|---|---|---|
| 3,434,866 | 3/1969 | Boggs et al. | 117/47 |
| 3,437,507 | 4/1969 | Jensen | 117/47 |
| 3,442,683 | 5/1969 | Lenoble | 117/47 |
| 3,146,125 | 8/1964 | Schneble, Jr. et al. | 29/625 |
| 3,259,559 | 7/1966 | Schneble, Jr. et al. | 117/212 X |
| 3,269,861 | 8/1966 | Schneble, Jr. et al. | 117/212 |
| 3,399,268 | 8/1968 | Schneble, Jr. et al. | 174/68.5 |

*Primary Examiner*—Alfred L. Leavitt
*Assistant Examiner*—Alan Grimaldi
*Attorney*—Morgan, Finnegan, Durham & Pine

ABSTRACT: This invention relates to metallizing insulating base materials and more particularly to rendering insulating materials sensitive to electroless metal deposition and then depositing electroless metal on the sensitized material, and to the resulting new and improved metallized articles, including printed circuit boards.

BASE MATERIAL AND METHOD FOR THE MANUFACTURE OF PRINTED CIRCUITS

Wirings, by means of so-called printed circuits, have gained extensive acceptance in practice. In the simplest case such printed circuits, also known as circuit boards, consist of conductive lines, for instance of copper foil, which are firmly anchored onto a surface of insulating material. For complicated wirings, it has proven advisable to arrange such conductive lines on both sides of an insulating board and to connect corresponding conductive lines to each other through the insulating layer at a predetermined point. In this connection, it has been found particularly advantageous to produce by a combination of metal deposition layers operating with and without the feeding of current from the outside, a metallic connection along the wall of suitable openings in the insulating material, such as for instance, punched or drilled holes, which provide a direct connection from one conductive line on the one side to a conductive line on the other side of the circuit board. Such metallized hole walls have not only proven to constitute extremely dependable electrical connections, but at the same time result in a substantial improvement in solder connections to the terminal of components and the like. The reason for this is that the space between the metallized wall of the hole and the wire inserted in said hole can be filled entirely with solder. For this reason, one has gone over recently to providing metallized hole walls in printed circuits which have a pattern of conductive lines only on one side of the circuit board.

For the manufacture of circuit boards without metallized hole walls, the so-called foil-copper etching process has been particularly employed. For this process, there is used a base material which bears a copper film of a thickness of for instance 35$\mu$ on the insulating board, consisting for instance of a modified phenol paper laminated; if a circuit board which is equipped with conductive lines on both sides is desired, than an insulating board provided with a layer of copper foil in both sides is used as a base material. As foil, electrolytic copper foil is generally employed. It is deposited for instance by known galvanic methods on drums, stripped from the latter, oxidized on one side by means of a chemical process and bonded by a thermosetting adhesive to the surface of the insulating material. This backing process can preferably to be combined with the actual manufacture of the phenol paper laminate. For the actual production of the printed circuit, the copper surface of the base material described above is covered with an etch-resistant coating in such a manner that all those parts of the surface which correspond to the desired pattern of conductive lines are covered. This can be effected, for instance, offset printing, silk screen printing, photographic printing or by some other printing process. The boards which have been prepared in this manner are then subjected to the action of an etching agent, for instance iron trichloride or ammonium persulfate, for such a period of time that all the copper which is not masked is completely removed. Thereupon, the protective layer is removed so that the unetched regions of the foil which correspond to the desired pattern of conductive lines are exposed. It has at times also proven advisable to operate with an etch-resistant coating which itself has solder-favoring properties and, therefore, need not be removed after the etching. In average circuit boards, the ratio between the copper area forming the conductive lines and the insulating material surface is about 30 to 40 percent. This means that 60 to 70 percent of the original copper must be etched off. This is economically even more important since the copper foil used for the production of the base material is a high-priced product which must be free of pores and in the manufacture of which special care is required to assure good soldering properties.

In order to produce circuit boards which bear such printed circuits on both sides, one starts from material which is backed with copper foil on both sides and then the process described above is employed.

For the manufacture of metallized hole walls which are connected with their corresponding conductive lines, there is employed a method in which, in addition to an etching, currentless and galvanic deposition of metal are also used. For this purpose, the copper-backed board of base material is first of all provided with the holes to be metallized; thereupon the walls of the holes are activated, for instance, by treatment with silvernitrate solutions or with tin and noble metal ions for currentless deposition of metal and introduced into a bath which, without the application of current, deposits metal, for instance, nickel or preferably copper. In said bath a thin electrically conductive layer of metal is formed on the walls of the hole, said layer being electrically connected with the copper foil. Thereupon a protective coating is produced by a printing process which leaves free only those regions which correspond the desired pattern of conductive lines. Thereupon, a galvanic metal layer, preferably a copper layer, corresponding to the desired thickness of metal layer on the walls of the hole is applied this layer is thereupon covered, for instance again by galvanic deposition, with an etch-resistant protective coating. For this purpose, silver, tin, lead or gold may, inter alia, be used. Thereupon, the printed protective layer is removed and the thick copper foil which does not correspond to the desired pattern of lines which lies below same is etched away. This method is also characterized by its great expense with respect to copper. In addition to this it requires a relatively large amount of equipment and is actually only justifiable when the cost of manufacture of the individual circuit boards is relatively unimportant as compared with the cost of manufacture of the apparatus for which it is used.

For some time, however, it has been desired to be able to use circuit boards having metallized hole walls also for consumer goods. This is due, in particular, to the strong trend towards the miniaturizing of radio receivers and the like.

Another essential reason consists in the desire to be able to produce good solder connections in a simple and dependable manner. Particularly in the case of consumer goods such as radio and television receivers, it is indispensable to employ mass soldering processes such as dip soldering. If, however, ordinary circuit boards without metallized hole walls are used, a very precise inspection of the solder points is necessary as well as the resoldering of a large number of "cold" or otherwise defective solder connections. For this, a disproportionally large amount of personnel is required which necessarily has an unfavorable effect from a financial standpoint and is relatively prohibitive. Another source of the expense of the use of such circuit boards provided with metallized hole walls is that upon the manufacture, it is indispensable to thicken the copper foil galvanically in the region of the conductive lines by a layer which corresponds to that which is required as a minimum in the hole. This leads to conductive lines which have a needlessly thicker layer of copper. It is obvious, in order to avoid this disadvantage, to start from base material which is provided with a thinner layer of copper. First of all, however, it is found that the cost of manufacture for electrolytic copper foils of a thickness of less than 35$\mu$ is no longer determined by the price of the copper but substantially by the other expenses. I particular, however, it has proven impossible in practice to produce substantially thinner films and, therefore, films for instance of less than 10$\mu$, which are sufficiently free of pores and to be able to handle them in a somewhat dependable manner; special difficulties in handling occur, for instance, upon the attempt to apply such thin films by backing.

In order to eliminate the lack of economy which results from the high percentage of copper used or etched away, it has already been proposed to proceed from unbacked base material and therefore, for instance, phenolic paperboards and to provide them with a layer of metal and preferably copper, merely at the regions of the surface corresponding to the desired conductive lines.

For this purpose, it was proposed for instance, first of all, to carefully clean the surface of the phenolic paper, preferably using a mechanical process, such as brushing or sanding, in order to be certain of removing traces of parting agents. THereupon the surface which has been cleaned in this manner and at the same time preferably roughened somewhat, was activated by the action of suitable solutions for currentless deposition of metal. For this purpose, the use of solutions of salts of tin and noble metal have proven advisable. Thereupon, the entire surface of the insulating material is provided with a thin layer of metal, preferably a layer of copper, deposited from a bath operating without external supply of current. If the phenolic paperboard has been provided with holes already before the activation, they are provided in the same operation with this thin layer of metal. Thereupon the surface is provided as a rule, printed, with a coating which merely corresponds to the desired pattern of lines and then a correspondingly thick galvanic coat of metal is deposited in known manner in these regions. THereupon the protective layer is removed and the thin original copper foil is etched away. This method avoids the application of copper in regions in which it is not required, if one disregards the very thin first layer of copper. However, it has the serious drawback of lack of sufficient bond between the surface of the base material and the copper conductors. In order to remedy this defect, it has already been proposed to equip the surface of the insulating material with an adhesive and finally to subject the circuit board which has been equipped with the galvanically deposited conductive lines to a heat-hardening and pressing process. Such a process is not only relatively very expensive with respect to the apparatus required and the work inherent therein, but such hardening processes also require an exact supervision of the work, and thus go far beyond the scope of the operations customarily carried out by the manufacture of circuit boards. THey customarily transfer operations to be carried out by the manufacture of the base material to the manufacturer of the circuit boards.

Furthermore, it is regularly necessary to provide the original layer of metal which has been deposited without current with a galvanic protective coating unless extreme cost-increasing care is to be observed in the handling of the semifinished products. All of the leads to a complication and to an increase in price, and has the result that such methods have not been able to gain a foothold as compared with the foil etching methods.

The object of the present invention is to produce a base material which is adapted by means of currentless metal depositing processes alone or in combination with the galvanic processes of deposition for the manufacture of printed circuits or circuit boards—with and without metallized hole walls—in accordance with the invention economically and in a simple fashion.

Corresponding examinations which form the basis of the present invention show that it is possible to bond applied copper layers firmly to surfaces of insulating material without a pressing process with supply of heat being required for this. They have furthermore shown that it is possible to produce a base material for the manufacture of conductor boards which can be handled in a simple manner.

In accordance with the invention, the base material is characterized by the fact that the surface of a suitable support, for instance, of the type of phenolic paper, epoxide paper, epoxy fiberglas laminates, polyester laminates and the like, is provided with a layer which firmly adheres thereto, can be hardened by heat and contains at least one substance which is uniformly distributed in it and belongs to the group of modified rubbers or synthetic rubbers and can be oxidized and degraded by suitable oxidizing agents.

In accordance with the invention, the surface of the insulating material is first of all provided with said layer and subjected to heat treatment and thereupon oxidized, at least in the regions to be metallized, by means of an oxidizing agent and degraded with respect to the rubber or synthetic rubber contained in it. In this connection, it has been found of essential importance to adapt the hardening process and the oxidization process to each other and to interrupt the hardening process before reaching a condition in which the oxidizing agent used is no longer active or acts only very slowly. On the basis of experiments, it has been possible to shown that an adaption of the oxidization process to the hardening process is possible within wide limits and comprises a large tolerance; as a rule, the heating process can be carried out to close to complete hardening. However, it should be broken off before over hardening.

As suitable adhesive layers there can be employed, in accordance with the invention, those which contain a rubber or a synthetic rubber which is oxidizable and degradable. This component must be present in very finely divided form in the layer of the adhesive or at least on the surface thereof in a zone which has, for instance, a thickness of 10$\mu$. Types of rubber which can be used are, for instance, nitrile rubbers, butadiene styrenes, butyl, polybutylenes, neoprenes, Buna N, polyvinyl acetal resins, silicone rubber, carboxylic synthetic resins, modified polyamides, and products modified with phenol resin, epoxide resins and other suitable resins and synthetic substances. For example, there have been found suitable nitrile rubbers of the Hycar type (RTM) of B.F. Goodrich, Paracril brands of the Naugatuck Chemical Company (acrylonitrile-butadiene rubbers).

As oxidization and degradating agents, chromosulfuric acid and permanganate solutions have, for instance, proven suitable.

The manufacture of the base material in accordance with the invention will be explained in further detail below with reference to an example.

EXAMPLE I

As a base material there is used a laminated paperboard of class 4 of a thickness, for instance, of 1.5 mm. This board is first of all freed of all dirt, for instance, by means of an alkaline cleanser, should this be necessary. It is then provided with a coating of resin. As suitable plastic compositions for this purpose there can be used:

| | |
|---|---|
| Resin Mixture A | |
| Toluene | 50 g. |
| Diacetone alcohol | 50 g. |
| Butadiene-acrylonitrile rubber | 11 g. |
| Oil-soluble phenol formaldehyde resin | 7.5 g. |
| Cab-O-Sil (finely divided $SiO_2$) | 20 g. |
| or | |
| Resin Mixture B | |
| Epoxy resin | 15 g. |
| Butadiene-acrylonitrile rubber | 15 g. |
| Diacetone alcohol | 50 g. |
| Toluene | 50 g. |
| Oil-soluble phenol formaldehyde resin | 11 g. |
| Cab-O-Sil ($SiO_2$) | 25 g. |
| or | |
| Resin Mixture C | |
| Butadiene-acrylonitrile rubber | 15 g. |
| Clorinated rubber (viscosity 10 c.p.s.) | 20 g. |
| Diacetone alcohol | 75 g. |
| Nitromethane | 70 g. |
| Oil-soluble phenol formaldehyde | 10 g. |
| Ethanol | 10 g. |
| Cab-O-Sil ($SiO_2$) | 7 g. |
| Xylene | 50 g. |

The application can be effected in a known manner, for instance, by means of roll varnishing machines, scraper varnishing machines or by the dip process. The viscosity must be suitably adjusted depending on the type of application selected. If, for instance, application with a roller lacquering machine is selected, a viscosity of about 10,000 c.p.s. is advisable; on the other hand, values of between 500 and 1,000 c.p.s. are advantageous for the dip process. The viscosity is adjusted by addition of a solvent or filler, such as $SiO_2$.

For the present example, application by a roller shall be employed, with an adjustment which gives a dry thickness of coating of 20 to 30 microns. After the application of the coating, it is hardened. This can be done in infrared furnace or in a fresh-air circulating furnace. For the present example, a circulating furnace fed with fresh air is used.

As resin mixture, there is used the mixture of formula B, adjusted to a viscosity of 700 c.p.s. The application is effected by dipping, the speed with which the plates are moved out (vertically) being, for instance, 6 meters per hour. The hardening of the air predried boards is effected in a fresh air circulation oven at 150° C. for 4 hours. The cooled boards are of practically unlimited stability and life, and serve as one of the base materials in accordance with the invention.

EXAMPLE II

As a starting material there is again used a phenol formaldehyde paper press laminate; for coating by the dipping process there is used a resin mixture D;

| | |
|---|---|
| Methyl ethyl ketone | 415 g. |
| Cellosolve acetate | 2,375 g. |
| Nitrile rubber, liquid | 590 g. |
| Nitrile rubber, in lumps | 350 g. |
| Oil-soluble phenol resin, thermal setting | 350 g. |
| Epoxy resin (epichlorohydrin derivative) | 400 g. |
| $SiO_2$, finely divided | 300 g. |
| Butyl carbitol | 1,830 g. |
| Viscosity about 600 c.p.s. at 22° C. | |

The coated boards are hardened in a fresh air circulating oven at 155° C. for 3½ hours.

EXAMPLE III

Same as example II but with about 1,000 grams $SiO_2$ and an amount of solvent which gives a viscosity of about 12,000 c.p.s., the application being effected with a roller varnishing machine.

EXAMPLE IV

Same as example II, but with a modified rubber synthetic resin obtainable under the trade name Hysol (RTM) for the coating of the boards of supporting material, the viscosity being adjusted with methyl ethyl ketone to about 550 c.p.s. and the application being effected by the dip process with a speed or removal of about 7 meters per hour. The hardening is effected by heating to 130° C. for 45 minutes.

The base material produced for instance by any of the methods described above is subjected, for the production of a firmly adherent metal coating, first of all —at least in the regions to be metallized —to a suitable oxidizing or degrading agent. Chrome or sulfuric acid baths and permanganate solutions have, for instance, proven suitable. This treatment, in the opinion of applicant, effects an oxidation of the rubber component in the applied layer and the development of micropores extending depthwise in said layer by partial degradation thereof or of other components of the layer. A bath of the following composition can, for instance, be used for this purpose:

| Bath A | |
|---|---|
| Potassium bichromate | 37 g. |
| Water | 500 ml. |
| Concentrated sulfuric acid | 500 ml. |

If preprepared base material in accordance with example IV is used, the time of action is, for instance, 30 minutes at room temperature.

Thereupon, rinsing is effected in water and the remaining chromic acid is removed, possibly by means of a slightly acid 5 percent sodium sulfite solution or a 5 to 10 percent $Fe^{++}$ salt solution such as iron sulfate solution followed by rinsing with water.

The coated base plate which is on this way provided with micropores is of practically unlimited storage life provided merely that before further handling it is rinsed after lengthy storage for a short time in 10 percent HCl or some other suitable acid. In accordance with another proposal of the invention, therefore, the phenolic paperboard prepared in this manner can be stored as base material and used as required.

If the entire surface of the board of base material in accordance with example IV is to be covered with a metal layer, is is activated in a known manner, for instance by the action of stabilized silver salt solutions or palladium slat solutions for currentless deposition of metal. The surface is preferably first of all subjected, also in a known manner, to a bath which contains stannous ions. Thereupon, the activated board of base material is subjected to a bath which deposits metal without external current, for instance, one which can deposit nickel or copper.

Of course, instead of the board of example IV, there can also be used a board in accordance with any of the other examples having another coating corresponding to the invention. Similarly, for the oxidizing and production of the micropores, there can be used a chromosulfuric acid solution of different composition such as for instance:

| Bath B | |
|---|---|
| Sodium bichromate | 120 g. |
| Concentrated sulfuric acid | 600 ml. |
| Water | 500 ml. |

or a permanganate solution of corresponding concentration or some other suitable oxidizing and degrading agent. The time of action of this bath depends on the nature of the coating material and its condition of hardness and can be established in a simple manner by tests for each desired combination.

EXAMPLE V

This example describes the production of a copper coating which covers the entire surface of the base material.

For this purpose a base material which has been prepared in accordance with example IV or in another manner in accordance with the invention and provided with micropores is first of all subjected to solution which contains for instance 100 g. stannous chloride, 55 ml. hydrochloric acid and 1000 ml. water.

After rinsing, the surface is thereupon subjected to a bath which consists for instance of:

| | |
|---|---|
| Palladium chloride | 1 g. |
| Hydrochloric acid | 40 ml. |
| Water | 1,000 ml. |

After careful rinsing, the surface of the base material is subjected to a suitable copper deposition bath. In order to assure sufficient adherence between the copper film and the base and to avoid cracks occurring in the copper film upon subsequent shock vibrations or flexings, it has proved advisable and advantageous to see to it that the metal layer which is deposited without external current is of good ductility. Furthermore, it has been found from corresponding investigations that by the use of specific copper deposition baths it is possible to produce a metal layer which has great purity and on the basis of its structure and nature, permits the depositing on it of additional firmly adhering metal coatings produced without current or galvanically. Baths of a suitable composition contain, in addition to a complexing agent for the cupric ions, a complexing agent for cuprous ions in smaller quantity, as well as the other customary components. A suitable bath solution consists for instance of:

| Bath C | |
|---|---|
| $Cu_2So_4 \cdot 5H_2O$ | 30 g./l. |
| Rochelle salt | 150 g./l. |
| Wetting agent | 1 ml. |
| Sodium cyanide | 30 mg./l. |
| Formaldehyde (37%) | 15 ml./l. |

Sodium hydroxide in an amount which provides a pH of 13.

This bath produces a smooth lustrous copper precipitate of good ductility in a layer thickness of about 3 microns in 45 minutes or 6 microns in 1½ hours.

It has been found that such precipitates have an extremely long shelf life. They can be prepared by simple activation in, for instance, sulfuric acid even after long storage, for the application of another coating deposited galvanically or without current. Furthermore, said layers not only have a very high bond strength to the base, but furthermore since currentless depositions take place directionally they are substantially free of pores. Any porous islands which might form at the start of the deposition process due to activation imperfections are automatically filled up during the further course of the currentless metal deposition. In this way such metal foils differ fundamentally from galvanically produced foils. As a result of the fact that the formation of pores is unavoidable in the case of the latter as well as due to the extreme difficulties in the production of very thin galvanically deposited foils and their application to a support, it was practically impossible heretofore to produce a base material provided with a thin copper foil of a thickness of for instance 10 microns. However, this can be done in accordance with the present invention; the base material produced in accordance with the present invention is an extremely stable structure. The substantially pore free copper foil of slight thickness is highly ductile, adheres extremely strongly to the base, and makes it possible without difficulty to deposit further metal layers which adhere firmly to it. The product in accordance with the invention, since it has excellent storage life, constitutes a base material which is particularly well suited for the production thereon in very simple manner of printed circuits with or without metallized hole walls.

In order to produce, for instance, a circuit board provided with a printed circuit on both sides, the base material is provided in the manner of the product described in example V by one of the known printing processes or otherwise with a covering mask which leaves free only those areas which correspond to the desired conductive lines. Thereupon, the layer which has thus been masked is subjected to a bath which deposits metal, for instance copper, without current, and left therein until a deposit of sufficient thickness has been reached. THereupon the mask is removed in a customary manner and the base material copper foil located thereunder is removed by brief treatment with ammonium persulfate or some other suitable solvent. This takes place extremely rapidly and economically since the base material foil consists of a layer of copper which is extremely thin as compared with ordinary copper-backed base materials.

This method will be described in further detail in the following example:

EXAMPLE VI

As starting material there is used a base material produced for instance in accordance with example V, having a thickness of copper film of for instance 5 microns and a copper film completely covering both its sides.

In order to produce a circuit board with printed circuit on both sides, a mask is first of all printed on both sides of the base material, in this example by silk screen printing. THis mask corresponds to the negative of the desired pattern of conductive lines and, therefore, leaves uncovered the regions corresponding to the desired lines. As ink there is used a composition which on the one hand has good resistance to the other bath liquids employed, while on the other hand can be removed in a simple manner by means of a suitable solvent. Such printing inks are available in large number. Their resistance is preferably improved by a hardening process, for instance by drying with heat. The base material board provided with the mask imprint is thereupon cleaned for a short time, for instance in an alkaline solution, and after rinsing with water the copper surface is reactivated, for instance in sulfuric acid (10percent). Thereupon the board is brought into a bath which deposits ductile metal, for instance ductile copper, without external supply of current, and left therein until a copper layer of the desired thickness has been built up in the regions corresponding to the pattern of conductive lines. One particularly suitable bath consists for instance of a bath solution having the following composition:

| | Mol/Liter |
|---|---|
| Copper sulfate | 0.002 to 0.15 |
| Formaldehyde | 0.05 to 3.5 |
| Complexing agent for cupric ions | 0.001 to 0.25 |
| Complexing agent for cuprous ions | 0.00005 to 0.09 |
| Alkali hydroxide—to establish a pH of between 10 and 14. | |

Such a bath consists of for instance:

| | |
|---|---|
| Bath D | |
| $CuSo_4 \cdot 5H_2O$ | 15g./l. |
| Rochelle salt | 45 g./l. |
| Sodium cyanide | 0.7 g./l. |
| HCHO (37%) | 10 ml./l. |

Sodium hydroxide is excellently suited to establish a pH of 13.5. A bath of the following composition is also very suitable.

| | |
|---|---|
| Bath E | |
| $CuSo_4 \cdot 5H_2O$ | 5 g./l. |
| Trisodium nitrilotriacetate (40%) | 23 ml./l. |
| Glyconitrile | 12 mg./l. |
| 2-Mercaptobenzolthiazol | 0.08 mg./l. |
| HCHO (37%) | 10 ml./l. |
| Wetting agent | 2 g./l. |
| Sodium hydroxide | 2.1 g./l. |
| or | |
| Bath F | |
| $CuSo_4 \cdot 5H_2O$ | 10 g./l. |
| Trisodium-N-hydroxyethylethylene diaminetriacetate (41%) | 15 ml./l. |
| Sodium hydroxide | 2 g./l. |
| Formaldehyde (37%) | 6 ml./l. |
| Thiodiethanol | 0.000015 ml./l. |
| Sodium cyanide | 10 mg./l. |
| Wetting agent | 1 g./l. |

These baths give extremely ductile copper precipitates of high luster, of a thickness of for instance 35 microns in 15 hours.

As soon as the desired thickness of the metal layer has been reached, the masking ink is dissolved off, the goods carefully rinsed, and then for instance treated with a watered dipping varnish to prevent corrosion.

EXAMPLE VII

This example constitutes another method in accordance with the invention. In this case, the metal layer forming the pattern of conductors is built up galvanically.

First of all, as described in example VI, a mask is applied which leaves uncovered merely the regions corresponding to the pattern of conductors. Thereupon the board is introduced into a galvanic metal depositing bath, for instance into a pyrophosphate-copper bath, the electrical connection being effected from the suspension rack to the thin copper foil of the base material. After a suitable time of electroplating, for instance at the end of about 45 minutes for 35 microns copper, the plated areas are washed, and after removal of the ink and dissolving of the base material copper, lying exposed between the conductive lines, provided with a protective coating to prevent corrosion.

EXAMPLE VIII

This example describes the manufacture of circuit boards having metallized hole walls with the use of the method steps described in examples VI and VII. In this case, the base material of the type described in examples VI and VII is first of all provided with the holes and opening, the walls of which are to be metallized and/or serve as connections between conductive lines on the two sides of double-sided circuit boards. Thereupon the base material board which has been provided with the holes is treated for instance by means of a solution containing tin ions and noble metal ions in order to activate the hole walls for the currentless deposition of metal. Thereupon the mask is printed as described in examples VI and VII, and one proceeds further in the manner described therein, it being necessary however in all cases first of all to produce a currentless layer of metal, possible of slight thickness.

In this connection it should be pointed out that currentless and galvanic deposition of metal can be combined together and therefore for example a layer of metal of desired thickness can be produced in part by deposition from a bath operating without current, and in part by galvanic deposition. This can be particularly advantageous when the final conductive line is to consist of metals of different type, and therefore for instance of 20 microns copper, 8 microns nickel and 2 microns gold.

For the activating of the hole walls there has proven particularly advantageous a bath solution which consists of an aqueous solution of tin ions and palladium ions and of 0.1 to 5 percent methylethyl ketone. This same solution can also be successfully used for the activation before the application of the first thin copper film.

Finally, investigations have shown that the completed circuit board, before the application of a corrosion protection, can be exposed for a short time to an acid bath in order in this way to remove all traces of salt still remaining from earlier method steps.

In accordance with a other embodiment of the invention, one proceeds for the manufacture of circuit boards from a base material of the type of materials described in example I or II. THese materials consist, as stated in further detail there, of a suitable support material, for instance a phenolic paper laminate which is provided with a suitable surface coating. This base material is first of all covered with a mask which is resistant to the oxidation and degradation baths into the baths of the activating process for the currentless deposition of metal, which mask merely leaves free the portions of the surface which correspond to the later pattern of conductors. The printing can be effected for instance by silk screen printing and printing inks of high resistance to etching have proven particularly suitable. In order further to improve their resistance it may be advisable to harden them by a heat process. If the conductor boards are to be provided with metallized hole walls, the corresponding holes are produced either before or after the application of this mask.

Thereupon the exposed surface of the base material is subjected to the oxidation and degradation agent, for instance a permanganate solution, for a period of time which is sufficient to bring about sufficient oxidation and to form micropores. Thereupon the surface of the board, after prior rinsing, is activated, and therefore for instance subjected to a solution containing tin and noble metal ions. The solution containing the noble metal ions preferably contains a small percentage, for instance up to 5 percent of methylethyl ketone. After the rinsing the masking ink is removed. It has been found particularly advantageous to use masking inks which can be dissolved off in alkaline solutions. Thereupon the base material board which has been treated in this manner is subjected to a suitable bath which deposits metal without the application of current for a period of time sufficient to build up a layer of the desired thickness.

The currentless baths described in the preceding examples can be used to particular advantage. Thereupon the boards are carefully rinsed and provided with corrosion protection, possibly after further cleaning and neutralizing baths. As such there can be employed for instance a water dipping varnish or a layer of tin applied by spraying or roller tinning.

In this embodiment of the invention the fact is particularly advantageous that there cannot be any traces of substances from the activating cycle between the conductors which might, in the absence of careful cleaning, lead to an impairment in the surface resistance.

On the other hand, it may possibly be simpler under certain circumstances from a standpoint of method technique to start from a base material such as that corresponding to example III. This material has a surface layer which has already been treated with the oxidizing and degradation agent. For the further working into circuit boards, there are two possible methods of procedure. In accordance with one thereof, the mask is first of all applied and one then proceeds in the manner described in the example given for base material in accordance with examples I and II.

However, the entire unmasked surface can also first be activated for the currentless deposition of metal and the mask printed thereon only after this. Aside from this difference, it is the same as indicated for the first variant.

It should also be pointed out that the invention is not limited to the use of copper whether for the building up of the metal film of the base material in accordance with example V or for the building up of the conductors on one of the base materials in accordance with examples I to V. Although copper is the preferred metal, other metals such as nickel may possibly by used to advantage.

The invention in its broader aspects is not limited to the specific steps, methods, compositions, combinations and improvements described but departures may be made therefrom within the scope of the accompanying claims without departing from the principles of the invention and without sacrificing its chief advantages.

What is claimed:

1. As a new article of manufacture an insulating base material comprising an insulating core and an insulating resinous layer adhered to the core and heat cured thereon, said layer having uniformly distributed therein finely divided particles consisting essentially of a member selected from the group consisting of oxidizable and degradable natural and synthetic rubber and mixtures thereof, the finely divided rubber particles adjacent the exposed surface of said resinous layer having been degraded by exposure to an oxidizing chemical to render the insulated resinous layers microporous.

2. The article of claim 1 wherein said microporous surface is catalytic to the reception of electroless metal.

3. The article of claim 2 wherein an electroless metal deposit is adhered to the catalytic, microporous surface of the resinous layer.

4. A printed circuit board comprising an insulating core, an insulating resinous layer adhered to the core and heat cured thereon, said layer having uniformly distributed therein finely divided particles consisting essentially of a member selected from the group consisting of oxidizable and degradable natural and synthetic rubber and mixtures thereof, and the exposed surface of such layer having an electroless metal adhered thereto in a desired conductor pattern such exposed layer having first been rendered microporous by degrading the finely divided rubber particles adjacent the exposed surface of said resinous layer with an oxidizing agent, sensitized and then contacted with an electroless metal deposition solution to achieve the desired conductor pattern.

5. The printed circuit board according to claim 4 wherein the desired conductor pattern consists of an electroless metal deposit and a galvanic metal deposit.

6. The printed circuit board of claim 4 wherein the desired conductor pattern included plated through holes.

7. The method of manufacturing printed circuit boards which comprises establishing an insulating base material comprising an insulating core and an insulating resinous layer adhered to the core and heat cured thereon, said resinous layer comprising finely divided particles consisting essentially of a member selected from the group consisting of oxidizable and degradable natural and synthetic rubber and mixtures thereof, masking selected portions of the surface to leave exposed areas corresponding to a desired pattern of conductors, degrading the finely divided rubber particles adjacent the surface of the resinous surface with an oxidizing chemical to render the exposed areas microporous, sensitizing the resulting microporous surface to the reception of electroless metal, and then contacting the resulting surface with an electroless metal deposition solution to form a deposit of electroless metal of a desired thickness on the exposed areas to form the desired pattern of conductors.

8. The method of claim 7 wherein holes are provided in the base, and the walls surrounding the holes are provided with the insulating resinous layer in which the finely divided rubber particles adjacent the surface have been degraded with an oxidizing chemical to render it microporous, including the steps of sensitizing the microporous areas and contacting the base with an electroless metal deposition solution to form a desired conductor pattern with plated through holes.

9. In a process for metallizing an insulating base material which comprises contacting a sensitizing base material with an electroless metal deposition solution the improvement which comprises establishing an insulating base material comprising an insulating core and an insulating resinous layer adhered to the core and heat cured thereon said resinous layer comprising finely divided particles consisting essentially of a member selected from the group consisting of oxidizable and degradable natural and synthetic rubber and mixtures thereof, degrading the finely divided rubber particles adjacent the surface of the resinous layer with an oxidizing agent to render it microporous, sensitizing the resulting microporous surface to the reception of electroless metal, and then contacting the sensitized microporous surface with an electroless metal deposition solution to adherently deposit electroless metal thereon.

10. The method of claim 9 wherein the oxidizing agent is a mixture of chromic acid and sulfuric acid.

11. The method of claim 10 wherein electroless metal deposition is continued until the deposit has a thickness of between about 0.5 and 5 microns.

12. The method of claim 9 wherein the sensitized microporous surface is contacted with an electroless metal deposition solution followed by a galvanic deposition of said metal.

13. The method of manufacturing printed circuit boards which comprises establishing an insulating base material comprising an insulating core and an insulating resinous layer adhered to the core and heat cured thereon, said resinous layer comprising finely divided particles consisting essentially of a member selected from the group consisting of oxidizable and degradable natural and synthetic rubber and mixtures thereof, degrading the finely divided rubber particles adjacent the surface of the resinous surface with an oxidizing chemical to render the exposed areas microporous, printing the insulating resinous layer following treatment with the oxidizing chemical with a mask which leaves free regions corresponding to the desired circuit pattern sensitizing the said free regions to the deposition of electroless metal, removing the mask and subjecting the resulting article to an electroless deposition solution do deposit metal on the sensitized areas.

14. The method of claim 13 wherein holes are provided in the base and the walls surrounding the holes are provided with the insulating resinous layer in which the finely divided rubber particles adjacent the surface have been degraded with an oxidizing chemical to render it microporous, including the steps of sensitizing the microporous areas and contacting the base with an electroless metal deposition solution to form a desired conductor pattern with plated through holes.

* * * * *